United States Patent
Sugimura et al.

(10) Patent No.: US 8,784,973 B2
(45) Date of Patent: Jul. 22, 2014

(54) RESIN BONDING METHOD BY PHOTOIRRADIATION, METHOD FOR PRODUCING RESIN ARTICLE, RESIN ARTICLE PRODUCED BY THE SAME METHOD, METHOD FOR PRODUCING MICROCHIP, AND MICROCHIP PRODUCED BY THE SAME METHOD

(75) Inventors: Hiroyuki Sugimura, Kyoto-fu (JP); Yoshihiro Taguchi, Miyagi-ken (JP); Yoshinao Taniguchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 249 days.

(21) Appl. No.: 13/396,488

(22) Filed: Feb. 14, 2012

(65) Prior Publication Data
US 2012/0140335 A1 Jun. 7, 2012

Related U.S. Application Data

(60) Division of application No. 12/823,088, filed on Jun. 24, 2010, now Pat. No. 8,246,774, which is a continuation of application No. PCT/JP2008/073703, filed on Dec. 26, 2008.

(30) Foreign Application Priority Data

Dec. 27, 2007 (JP) ................................. 2007-337411

(51) Int. Cl.
| | | |
|---|---|---|
| *B32B 3/00* | (2006.01) |
| *B29C 65/00* | (2006.01) |
| *B29C 65/14* | (2006.01) |
| *B29C 65/76* | (2006.01) |
| *C09J 5/06* | (2006.01) |
| *B81C 3/00* | (2006.01) |
| *C08J 3/28* | (2006.01) |
| *C08J 5/12* | (2006.01) |
| *C08J 7/12* | (2006.01) |
| *B29L 31/30* | (2006.01) |
| *B29L 17/00* | (2006.01) |
| *B29K 69/00* | (2006.01) |
| *B29C 35/08* | (2006.01) |

(52) U.S. Cl.
CPC ......... *B29C 66/00143* (2013.01); *B29C 66/001* (2013.01); *B29L 2031/3061* (2013.01); *B29C 66/82661* (2013.01); *B29C 66/953* (2013.01); *B29C 65/1406* (2013.01); *C09J 2205/31* (2013.01); *B29C 66/45* (2013.01); *B29C 65/76* (2013.01); *C09J 5/06* (2013.01); *B81B 2201/0214* (2013.01); *B29L 2017/00* (2013.01); *B29K 2069/00* (2013.01); *B81C 3/001* (2013.01); *B29C 66/53461* (2013.01); *C08J 3/28* (2013.01); *B29C 65/1496* (2013.01); *B81C 2203/032* (2013.01); *B29C 66/91945* (2013.01); *C08J 5/121* (2013.01); *B29C 2035/0827* (2013.01); *B81B 2201/058* (2013.01); *C09J 2400/226* (2013.01); *C08J 7/123* (2013.01); *B29C 66/91* (2013.01); *C09J 2423/006* (2013.01); *B29C 65/14* (2013.01)
USPC .......................................................... 428/166

(58) Field of Classification Search
USPC ............... 428/161, 166, 178, 172; 156/273.9, 156/272.2
See application file for complete search history.

(56) References Cited

U.S. PATENT DOCUMENTS

| | | | | |
|---|---|---|---|---|
| 5,462,701 | A | * | 10/1995 | Hagemeyer et al. .......... 264/482 |
| 6,838,156 | B1 | | 1/2005 | Neyer et al. |
| 2002/0092767 | A1 | * | 7/2002 | Bjornson et al. ............. 204/451 |
| 2005/0079373 | A1 | | 4/2005 | Gmur |

FOREIGN PATENT DOCUMENTS

| | | |
|---|---|---|
| JP | 2003-509251 | 3/2003 |
| JP | 2004-43662 | 2/2004 |
| JP | 2005-80569 | 3/2005 |
| JP | 2005-171164 | 6/2005 |
| JP | 2005-257283 | 9/2005 |

(56) References Cited

FOREIGN PATENT DOCUMENTS

| | | |
|---|---|---|
| JP | 2008-19348 | 1/2008 |
| WO | 2008/007787 | 1/2008 |

OTHER PUBLICATIONS

Search Report for International Application No. PCT/JP2008/073703 dated Feb. 2, 2009.

Taniguchi et al., "Photoactivation Bonding of Cycloolefin Polymer Member", Polymer Preprints, Japan, May 10, 2007, vol. 56, No. 1, 2Pb022, p. 2399.

Kim et al., "Photochemical Surface Conversion and Bonding of Cycloolefin Polymer Substrate", The Surface Finishing Society of Japan, Sep. 11, 2007, 18E-4, pp. 250-251.

Murahara et al., "VUV Light Induced Substitution of Functional Groups on Polymer Surface and Adhesive Enhancement", Extended Abstracts (The 42$^{nd}$ Spring Meeting), The Japan Society of Applied Physics and Related Societies, vol. 0, Mar. 28, 1995, 29p-ZK-1, p. 1377.

Taniguchi et al., "Photoactivation Bonding of Cycloolefin Polymer Plates and Exfoliation of Adhered Plates", Abstracts, Annual Meeting of the Society of Polymer Science, Japan, May 8, 2008, vol. 57, No. 1, 2Pa043, p. 2139.

Kim et al., "Photochemical Activation of Cycloolefin Polymer Substrate Surfaces and Application to Bonding Techniques", Abstracts, Annual Meeting of The Society of Polymer Science, Japan, May 8, 2008, vol. 57, No. 1, 2Pb044, p. 2140.

Search Report dated Mar. 29, 2012 from EP 08867644.0.

Kim Y J et al., "Cycloolefin Polymer Kizai Hyomen no Hikari Kagaku Kasseika to Setsugo Gijutsu eno Oyo—Photochemical Activation of Cycloolefin Polymer Surfaces for Improved Adhesion". Abstracts, Annual Meeting of the Society of Polymer Science, Jan. 1, 2007, p. 1465, XP008138651.

* cited by examiner

*Primary Examiner* — Catherine A Simone

(74) *Attorney, Agent, or Firm* — Beyer Law Group LLP

(57) ABSTRACT

A resin bonding method according to the present invention is a resin bonding method for bonding a first resin and a second resin including (I) a step of irradiating spaces containing oxygen molecules with vacuum ultraviolet light having a wavelength of 175 nm or less, the spaces being in contact with surfaces of the first and second resins; and (II) a step of, after the irradiation, subjecting the surfaces to temperature rise while the surfaces are in contact with each other, to bond the first resin and the second resin together with the surfaces serving as bonding surfaces. In the step (I), the surfaces of the first and second resins may be further irradiated with the vacuum ultraviolet light. In this case, a light amount of the vacuum ultraviolet light having reached the surfaces is preferably, for example, 0.1 J/cm$^2$ or more and 10 J/cm$^2$ or less.

18 Claims, 10 Drawing Sheets

RESIN BONDING METHOD BY PHOTOIRRADIATION, METHOD FOR PRODUCING RESIN ARTICLE, RESIN ARTICLE PRODUCED BY THE SAME METHOD, METHOD FOR PRODUCING MICROCHIP, AND MICROCHIP PRODUCED BY THE SAME METHOD

CLAIM OF PRIORITY

This application is a Divisional of U.S. application Ser. No. 12/823,088 filed on Jun. 24, 2010, now U.S. Pat. No. 8,246,774, which is a Continuation of International Application No. PCT/JP2008/073703 filed on Dec. 26, 2008, which claims benefit of Japanese Patent Application No. 2007-337411 filed on Dec. 27, 2007, all of which are hereby incorporated by reference.

BACKGROUND OF THE INVENTION

1. Field of the Invention

The present invention relates to a resin bonding method by irradiation with light (vacuum ultraviolet light); and a method for producing a resin article and a method for producing a microchip in which the resin bonding method is employed. The present invention further relates to a resin article and a microchip produced by such methods.

2. Description of the Related Art

In general, a method for bonding resins is performed by bonding by thermal fusion or bonding by coating an organic solvent or an adhesive. Bonding by thermal fusion is generally performed at the glass transition temperatures of resins or higher.

Microchips typically having a structure in which a pair of substrates are bonded together so as to face each other, at least one of the substrates including a microchannel in a surface, have been attracting attention. Microchips are also referred to as micro-fluid devices.

In microchips, by providing regions having various functions such as a reaction region where a reagent is placed in channels also referred to as microchannels, chips suitable for various applications can be provided. Microchips are typically applied to analyses such as gene analyses, clinical diagnosis, and drug screening in the fields of chemistry, biochemistry, pharmacy, medicine, and veterinary medicine; synthesis of compounds; environmental measurements; and the like. When microchips are used for such applications, for example, compared with the cases where existing analytical instruments suitable for similar applications are used, the following advantages can be provided: for example, (1) the amounts of a sample and a reagent necessary for an analysis can be reduced; (2) analysis time can be reduced; and (3) chips are disposable and hence safety and measurement accuracy can be enhanced in the field of medicine and the like.

Microchips have been mainly formed of glass substrates because glass substrates are easy to produce and allow optical detection. However, microchips formed of glass substrates are likely to be damaged by external impacts and the weight of such microchips is problematic upon transportation, disposal, and the like. Accordingly, developments of microchips formed of resin substrates that are lightweight but less likely to be damaged and inexpensive compared with glass substrates have been performed.

In microchips formed of resin substrates, a method for bonding the resin substrates together is important.

To bond resin substrates together, a general method for bonding resins such as thermal fusion can be employed. However, since bonding by thermal fusion is generally performed at the glass transition temperatures of resins or higher, there are cases where substrates deform upon bonding and the resultant microchips do not function. In addition, since the influence of deformation of substrates becomes severe when the width of channels is decreased or the pattern of channels is made complicated, it is difficult to make microchips highly functional by bonding performed by thermal fusion.

Deformation of resin substrates can be suppressed by bonding at lower temperature. As such a bonding method, Japanese Unexamined Patent Application Publication No. 2005-80569 discloses a microchip joining method in which a portion having no channels in a substrate having microchannels in a surface is coated with an organic solvent and the substrate is then placed on a substrate having a flat surface and these substrates are fused together.

Japanese Unexamined Patent Application Publication No. 2005-257283 discloses a microchip production method in which a polydimethylsiloxane (PDMS) substrate and a resin substrate (counter substrate) composed of a material other than PDMS are bonded together. In this production method, a PDMS substrate in a surface of which microchannels are formed and a counter substrate on a surface of which a silicon oxide film is formed are prepared. After the bonding surfaces of the substrates are subjected to a modification treatment, the substrates are bonded together with the silicon oxide film therebetween. A described example of such a modification treatment for bonding surfaces is an oxygen plasma treatment, specifically, an oxygen plasma treatment in which irradiation with excimer ultraviolet light in an oxygen atmosphere is performed (for example, paragraph [0017] of Japanese Unexamined Patent Application Publication No. 2005-257283).

Although the following is not directly related to microchip production methods, Japanese Unexamined Patent Application Publication Nos. 2005-171164 and 2004-43662 disclose a method in which surfaces of olefin resins are irradiated with light to activate the surfaces (in Japanese Unexamined Patent Application Publication No. 2005-171164, a photopolymerizable resin for surface modification is also used), the activated surfaces are coated with a resin composition such as a hot-melt adhesive or an ultraviolet curable resin, and the resins are bonded together with the composition therebetween.

SUMMARY OF THE INVENTION

In the method according to Japanese Unexamined Patent Application Publication No. 2005-80569, an organic solvent is coated so as to avoid channels since entry of an organic solvent into channels causes erosion, alteration, or the like of resins forming substrates, which can cause clogging of channels, degradation of characteristics of microchips, or the like. However, such a coating step of an organic solvent can degrade productivity of microchips. In addition, in the production of microchips in which the width of channels is decreased or the pattern of channels is made complicated for the purpose of making microchips highly functional or the like, it is difficult to apply such a coating step of an organic solvent depending on the degree of the decrease or the complication.

In the method according to Japanese Unexamined Patent Application Publication No. 2005-257283, since organic solvents or adhesives are not used, clogging of channels, degradation of characteristics of microchips, or the like is less likely to be caused, compared with the method according to Japanese Unexamined Patent Application Publication No.

2005-80569. However, the method according to Japanese Unexamined Patent Application Publication No. 2005-257283 is used only for bonding between a silicon oxide film and a substrate of PDMS, which is a silicone resin including Si—O bonds and has a high affinity for a silicon oxide film. Thus, the method is not used for bonding together resin substrates other than PDMS substrates.

The methods according to Japanese Unexamined Patent Application Publication Nos. 2005-171164 and 2004-43662 require coating of substrate surfaces with a resin composition, which causes clogging of channels or the like. Accordingly, it is difficult to apply these methods without change to methods for producing microchips. As in Japanese Unexamined Patent Application Publication No. 2005-80569, a resin composition may be coated so as to avoid channels. However, as described above, such a coating step can degrade productivity of microchips. In addition, when the width of channels is decreased or the pattern of channels is made complicated, it is difficult to apply such a coating step.

In summary, when microchips are produced, a resin bonding method is demanded by which resin substrates can be bonded together at a temperature lower than that in bonding by thermal fusion, without performing coating of organic solvents or resin compositions, which degrades the productivity of the chips and can cause clogging of channels or the like. In addition, such a bonding method is expected to be applied to production methods not only for microchips but also for various resin articles.

A resin bonding method according to the present invention is a resin bonding method for bonding a first resin and a second resin together including: (I) a step of irradiating spaces containing oxygen molecules with vacuum ultraviolet light having a wavelength of 175 nm or less, the spaces being in contact with surfaces of the first and second resins; and (II) a step of, after the irradiation, subjecting the surfaces to temperature rise while the surfaces are in contact with each other, to bond the first resin and the second resin together with the surfaces serving as bonding surfaces.

Note that, in the step (I) of a resin bonding method according to the present invention, the spaces being in contact with surfaces of the first and second resins are spaces immediately above the surfaces of the first and second resins. The spaces are preferably spaces within 0 to 30 mm from the surfaces, more preferably, spaces within 0 to 1 mm from the surfaces.

A bonding method according to the present invention can be applied to a method for producing a resin article including a portion in which a resin and a resin are bonded together. That is, a method for producing a resin article according to the present invention is a method for producing a resin article including two or more parts including resin portions, the two or more parts being bonded together through the resin portions, wherein the resin portions are bonded together by the above-described bonding method according to the present invention.

In addition, the present invention provides a resin article produced by the above-described method for producing a resin article according to the present invention. A resin article according to the present invention is a resin article produced by the above-described method for producing a resin article according to the present invention, wherein the resin portions of the two or more parts are bonded together such that the resin portions can be separated from each other by using at least one liquid at 40° C. or more selected from water and alcohol or by using a liquid less than 40° C. and ultrasonic vibrations.

A method for producing a resin article according to the present invention can be applied to methods for producing various resin articles, for example, microchips. That is, a method for producing a microchip according to the present invention is a method for producing a microchip including a pair of resin substrates bonded together so as to face each other, at least one of the resin substrates including a channel, wherein the resin substrates are bonded together by the above-described bonding method according to the present invention.

In addition, the present invention also provides a microchip produced by the above-described method for producing a microchip according to the present invention. A microchip according to the present invention is a microchip produced by the above-described method for producing a microchip according to the present invention, wherein the pair of resin substrates are bonded together such that the pair of resin substrates can be separated from each other by using at least one liquid at 40° C. or more selected from water and alcohol or by using a liquid less than 40° C. and ultrasonic vibrations.

The present invention also provides a resin bonding method for bonding a first resin and a second resin together including: (III) a step of irradiating spaces containing oxygen molecules with vacuum ultraviolet light having a wavelength of 175 nm or less, the spaces being in contact with surfaces of the first and second resins; and (IV) a step of, after the irradiation, subjecting the surfaces to temperature rise while the surfaces are in contact with each other, to bond the first resin and the second resin together with the surfaces serving as bonding surfaces, wherein, in the step (III), irregularities are formed in the surfaces of the first and second resins, the surfaces serving as the bonding surfaces; and, in the step (IV), the surfaces of the first and second resins are bonded together.

When a bonding method according to the present invention is employed, a resin and a resin can be bonded together with high productivity at a temperature lower than that in bonding by thermal fusion, without performing coating of organic solvents or resin compositions. In addition, resins having been bonded together by such a method can be readily separated from each other at the bonding surfaces by using a liquid such as water at 40° C. or more or by using a liquid less than 40° C. and ultrasonic vibrations. Accordingly, for example, a resin article formed by bonding together resin parts (parts including resin portions) by such a bonding method can be readily disassembled into the parts after use by immersing the resin article into hot water or the like. Thus, when a bonding method according to the present invention is employed, recycling of resin parts is facilitated.

When such a bonding method is applied to a method for producing a resin article, that is, in a method for producing a resin article according to the present invention, various advantages can be provided depending on the type of the article. In addition, since a resin article according to the present invention produced by such a production method has sufficiently high bonding strength between parts, the article has reliability. Furthermore, since such an article can also be readily disassembled into parts, recycling of parts is also possible.

When a bonding method according to the present invention is applied to a method for producing a microchip, that is, in a method for producing a microchip according to the present invention, a pair of resin substrates in at least one of which a channel is formed can be bonded together at a temperature lower than that in bonding by thermal fusion. Thus, deformation of the resin substrates upon the bonding can be suppressed. In addition, since coating of the bonding surfaces of substrates with an organic solvent or a resin composition is not necessary, the production method can be performed at high productivity; clogging of channels and degradation of characteristics of microchips can be suppressed during production; and, in addition, such a method can be more readily applied when the width of channels is decreased or the pattern of channels is made complicated. In addition, a microchip according to the present invention produced by such a production method has a sufficiently high bonding strength between resin substrates and hence the microchip has reliability. Furthermore, since such a microchip can also be readily disassembled into resin substrates, recycling of resin substrates is also possible.

DESCRIPTION OF THE PREFERRED EMBODIMENTS

A method for bonding resins according to the present invention will be described.

In a bonding method according to the present invention, spaces containing oxygen molecules are irradiated with vacuum ultraviolet light having a wavelength of 175 nm or less, the spaces being in contact with surfaces of the first and second resins (step (I)). Note that, hereafter, the surfaces of the first and second resins serving as bonding surfaces are sometimes simply referred to as "surfaces".

In a bonding method according to the present invention, the surfaces of the first and second resins may be further irradiated with vacuum ultraviolet light. That is, vacuum ultraviolet light may be appropriately adjusted in terms of irradiation intensity, irradiation distance, or the like such that the vacuum ultraviolet light reaches the surfaces of the first and second resins. By also irradiating the surfaces of the first and second resins with vacuum ultraviolet light, the first resin and the second resin can be efficiently bonded together. Hereinafter, a bonding method according to the present invention will be described with reference to drawings by using a case where spaces in contact with surfaces of the first and second resins and the surfaces are irradiated with vacuum ultraviolet light, the case serving as an example.

Figure 1A:
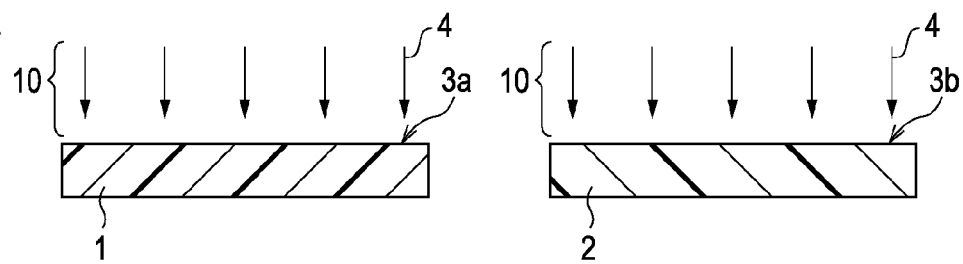
FIG. 1A is a process diagram schematically illustrating a bonding method according to an embodiment of the present invention.

As illustrated in FIG. 1A, spaces 10 in contact with surfaces 3a and 3b of a first resin 1 and a second resin 2, the surfaces 3a and 3b serving as bonding surfaces, and the surfaces 3a and 3b are irradiated with vacuum ultraviolet light 4 having a wavelength of 175 nm or less (step (I)). The spaces 10 being in contact with the surfaces 3a and 3b contain oxygen molecules. At this time, the light amount of the vacuum ultraviolet light 4 radiated to the spaces 10 and the surfaces 3a and 3b are not particularly restricted. However, by increasing the light amount reaching the surfaces 3a and 3b, the first resin 1 and the second resin 2 can be efficiently bonded together in a short period of time. Accordingly, to increase the amount of light reaching the surfaces 3a and 3b, for example, the distance from a light source to the surfaces 3a and 3b is desirably adjusted. Specifically, in the step (I), the irradiation intensity with the vacuum ultraviolet light 4, the distance from a light source to the surfaces 3a and 3b, and the irradiation time are desirably appropriately adjusted such that the light amount (hereafter, sometimes referred to as "reached light amount") of the vacuum ultraviolet light 4 reaching the surfaces 3a and 3b is made 0.1 J/cm2 or more and 10 J/cm2 or less. Note that, though the vacuum ultraviolet light 4 is radiated from the surfaces 3a and 3b sides in FIG. 1A, the radiation method is not particularly restricted to such a method. In a bonding method according to the present invention, at least the spaces 10 being in contact with the surfaces 3a and 3b should be irradiated with the vacuum ultraviolet light 4. Accordingly, when the first and second resins are, for example, resin sheets of polyethylene having high transmissivity, the vacuum ultraviolet light 4 may be radiated through surfaces opposite surfaces serving as bonding surfaces.

Figure 1B:
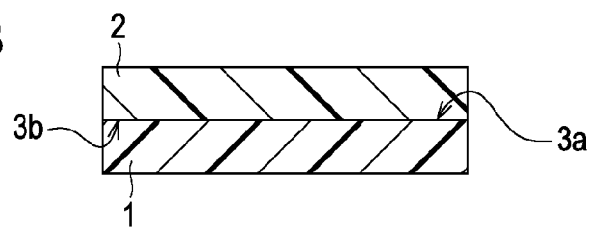
FIG. 1B is a process diagram schematically illustrating a bonding method according to an embodiment of the present invention.

After the step (I), as illustrated in FIG. 1B, the first resin 1 and the second resin 2 are bonded together with the surfaces 3a and 3b serving as bonding surfaces by subjecting the surfaces 3a and 3b to temperature rise while the surfaces 3a and 3b are in contact with each other (step (II)).

The reason why the first resin and the second resin are bonded together by the steps (I) and (II) is not clear; however, possible reasons are the following three phenomena.

First, the first phenomenon will be described. When the spaces containing oxygen molecules and being in contact with surfaces of the first and second resins are irradiated with vacuum ultraviolet light having a wavelength of 175 nm or less, the surface energy of the surfaces of the first and second resins is increased (activated) compared with prior to the irradiation with vacuum ultraviolet light and oxygen-containing hydrophilic functional groups (hydrophilic functional groups containing oxygen atoms) such as hydroxyl groups, carbonyl groups, or carboxyl groups are generated on the surfaces. Then, by subjecting the surfaces of the first and second resins to temperature rise while the surfaces of the resins are in contact with each other, bonds of some kind using the functional groups are generated between the surfaces of the first and second resins. Thus, the first resin and the second resin are probably bonded together with the surfaces serving as bonding surfaces.

Figure 2:
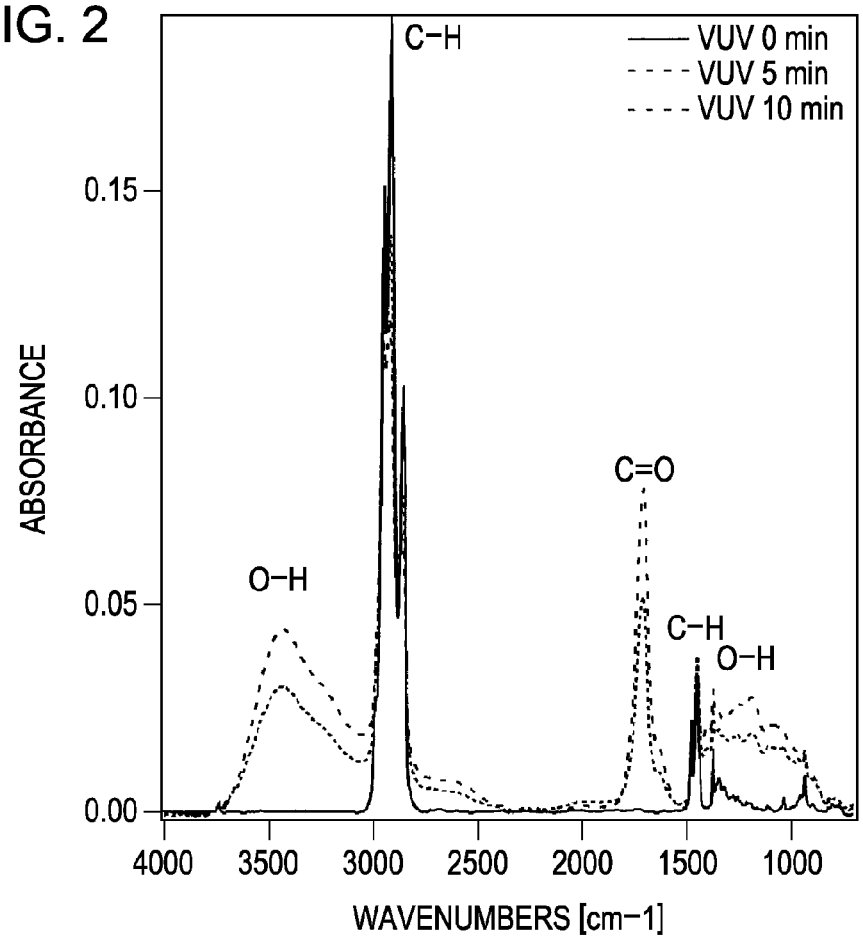
FIG. 2 illustrates results obtained by measuring with a Fourier transform infrared spectrophotometer the state of irradiated surfaces of resins having been irradiated with vacuum ultraviolet light having a wavelength of 172 nm at an irradiation distance of 5 mm.
Figure 3:
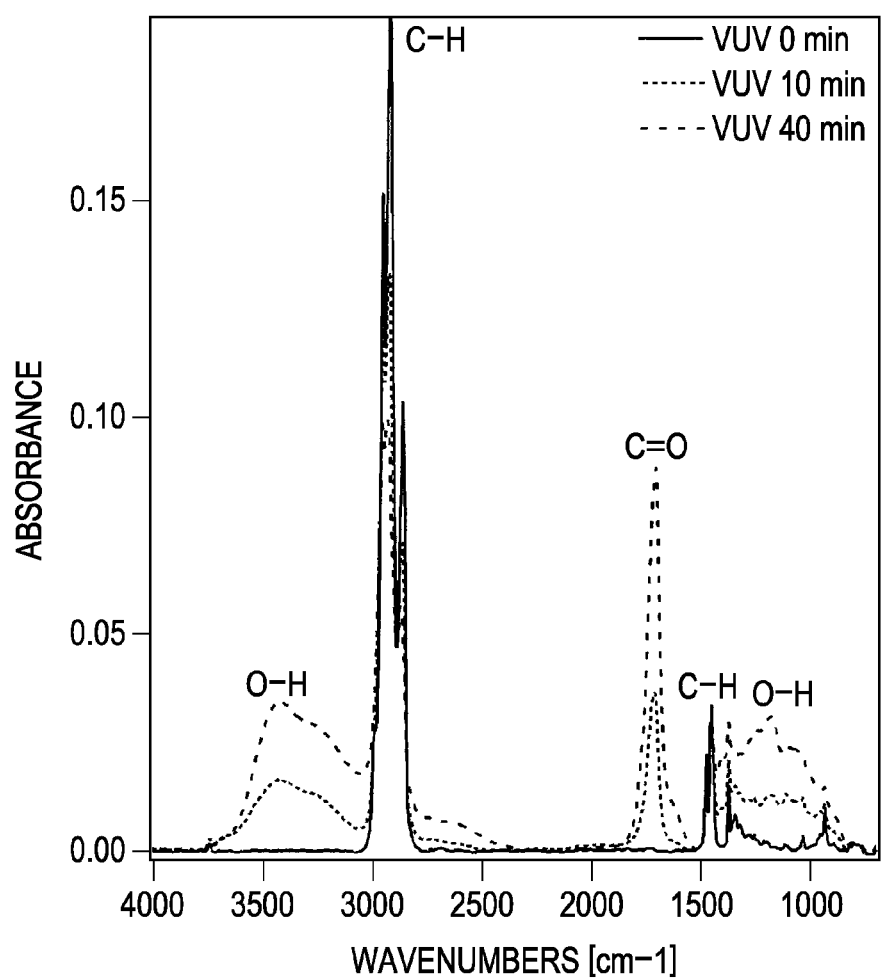
FIG. 3 illustrates results obtained by measuring with a Fourier transform infrared spectrophotometer the state of irradiated surfaces of resins having been irradiated with vacuum ultraviolet light having a wavelength of 172 nm at an irradiation distance of 30 mm.
Figure 4A:
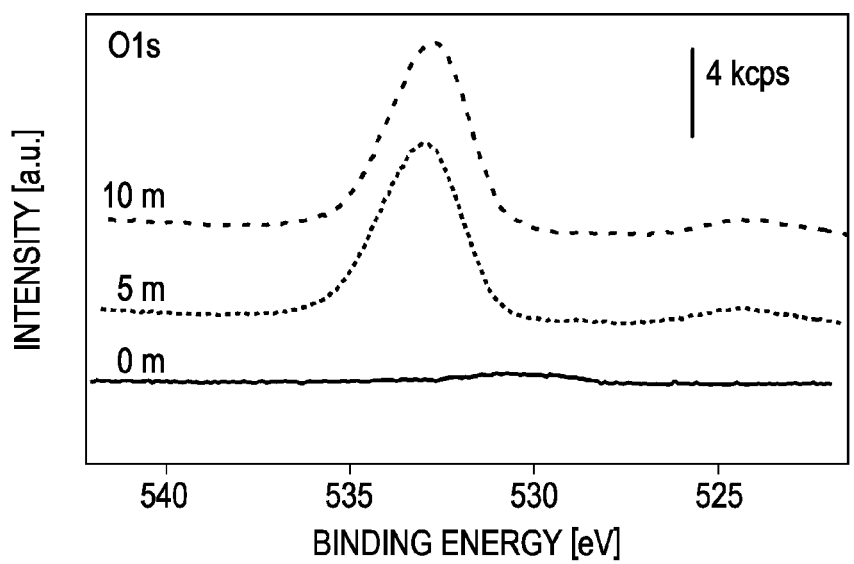
FIG. 4A illustrates results obtained by measuring by X-ray-induced photoelectron spectroscopy the state of an irradiated surface of a resin having been irradiated with vacuum ultraviolet light having a wavelength of 172 nm at an irradiation distance of 5 mm.
Figure 4B:
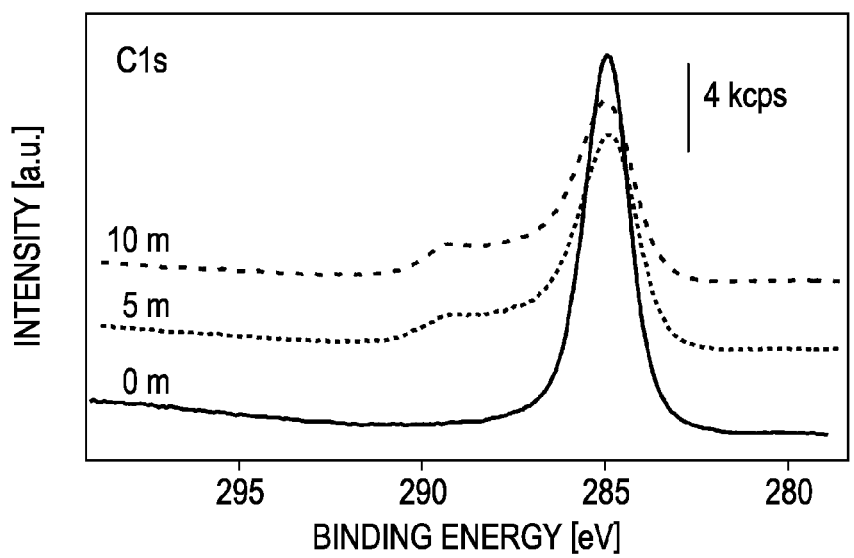
FIG. 4B illustrates results obtained by measuring by X-ray-induced photoelectron spectroscopy the state of an irradiated surface of a resin having been irradiated with vacuum ultraviolet light having a wavelength of 172 nm at an irradiation distance of 5 mm.
Figure 5A:
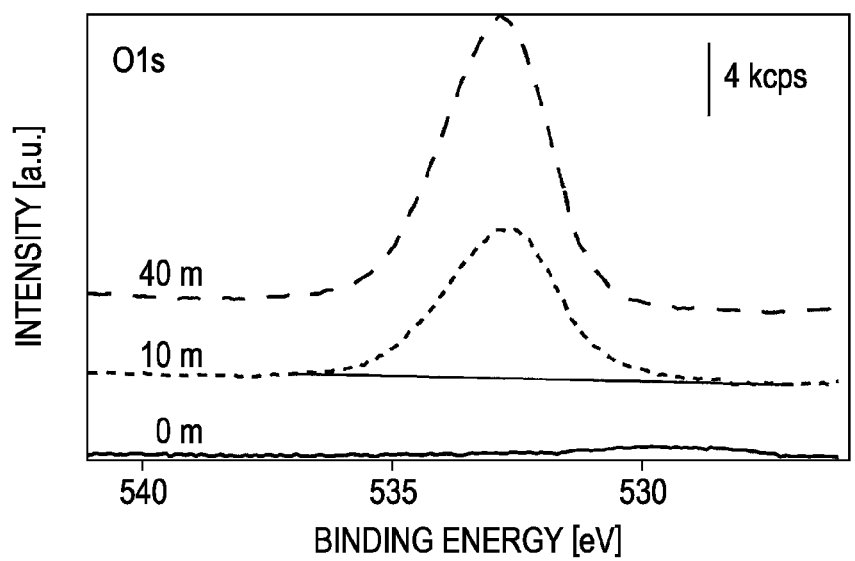
FIG. 5A illustrates results obtained by measuring by X-ray-induced photoelectron spectroscopy the state of an irradiated surface of a resin having been irradiated with vacuum ultraviolet light having a wavelength of 172 nm at an irradiation distance of 30 mm.
Figure 5B:
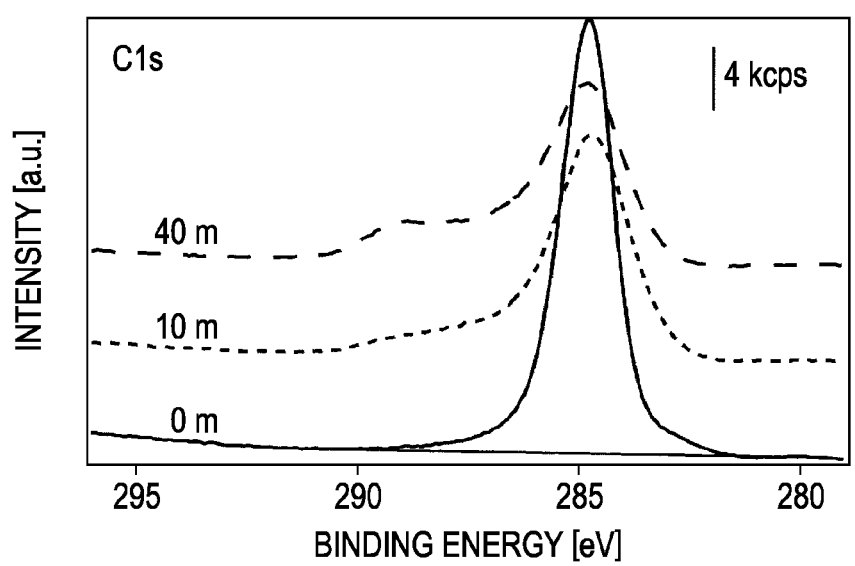
FIG. 5B illustrates results obtained by measuring by X-ray-induced photoelectron spectroscopy the state of an irradiated surface of a resin having been irradiated with vacuum ultraviolet light having a wavelength of 172 nm at an irradiation distance of 30 mm.

For reference, when surfaces of a resin are irradiated with, for example, vacuum ultraviolet light having a wavelength of 172 nm, the results of measurement of the state of the surfaces with an FT-IR (Fourier transform infrared spectrophotometer) are illustrated in FIGS. 2 and 3 and the results of measurement of the surfaces by X-ray-induced photoelectron spectroscopy (XPS) are illustrated in FIGS. 4A, 4B, 5A and 5B. The resin used in these measurements was a cycloolefin polymer and a light source used was an excimer lamp. The irradiation intensity was made 10 mW/cm2. The distance from the light source to the surfaces of the resin was made 5 mm or 30 mm. The irradiation time was made 0 minutes, 5 minutes, and 10 minutes. The results in the cases where the irradiation distance was 5 mm are illustrated in FIGS. 2, 4A, and 4B. The results in the cases where the irradiation distance was 30 mm are illustrated in FIGS. 3, 5A, and 5B. The results with the FT-IR show an increase in the amount of O—H groups and C=O groups on the surfaces of the resin. In addition, the results by XPS show that, compared with prior to the irradiation with vacuum ultraviolet light, after the irradiation, signals from oxygen considerably increase in the O1s spectra; and in the C1s spectra, signals from carbon decrease and signals (at about 290 eV in terms of binding energy) from carbon being bonded to oxygen are newly observed. These results show that oxygen-containing hydrophilic functional groups are probably generated on the surfaces of the resin.

Here, the necessity of use of vacuum ultraviolet light having a wavelength of 175 nm or less will be described. Note that vacuum ultraviolet light generally refers to ultraviolet light having a wavelength of 100 to 200 nm.

When oxygen molecules are excited with ultraviolet light, active oxygen species such as singlet oxygen atoms, triplet oxygen atoms, and ozone molecules are generated. Oxidation of organic molecules caused by such active oxygen species probably promotes a surface treatment and bonding of resins. Singlet oxygen atoms are most oxidative against organic molecules among the above-described active oxygen species.

When oxygen molecules absorb vacuum ultraviolet light having a wavelength of 175 nm or less, the oxygen molecules are dissociated from each other and turn into singlet oxygen atoms and triplet oxygen atoms. Some oxygen atoms bond to oxygen molecules to form ozone molecules. Ozone molecules absorb vacuum ultraviolet light having a wavelength of 175 nm or less and dissociate into singlet oxygen atoms and oxygen molecules.

Thus, by irradiating spaces containing oxygen molecules with vacuum ultraviolet light having a wavelength of 175 nm or less, singlet oxygen atoms are efficiently generated in the spaces. Accordingly, organic molecules in surfaces of resins in contact with the spaces are effectively oxidized and oxygen-containing hydrophilic functional groups are generated in the surfaces. Note that such a phenomenon is caused, even when surfaces of resins are not irradiated with vacuum ultraviolet light, by irradiating spaces (immediately above the surfaces) in contact with the surfaces with vacuum ultraviolet light. However, the phenomenon is more effectively caused by irradiating surfaces of resins with vacuum ultraviolet light.

Next, the second phenomenon will be described.

The surfaces of resins have irregularities of a certain degree. The more enhanced the flatness of resins by minimizing such irregularities, the more readily the resins can be joined together. When spaces containing oxygen molecules and being in contact with surfaces of the first and second resins are irradiated with vacuum ultraviolet light having a wavelength of 175 nm or less, the surfaces of the first and second resins in contact with the spaces are probably flattened. As a result of such flattening of the surfaces, when the surfaces of the resins are brought into contact with each other, the contact area between the surfaces increases and the resins are probably firmly bonded together. For example, it has been demonstrated that, by irradiating a resin substrate having surface irregularities of about 40 nm (irregularities having a height difference of about 40 nm) with vacuum ultraviolet light, the irregularities can be reduced to about 20 nm. In addition, when the surface of a cycloolefin polymer is irradiated with vacuum ultraviolet light having a wavelength of 172 nm at an irradiation intensity of 10 mW/cm2 and a distance of 5 mm from a light source to the surface of the resin, the state of the surface of the cycloolefin polymer is observed with an atomic force microscope. As a result, it has been demonstrated that the surface begins becoming gentle after irradiation for 5 minutes; and the longer the irradiation time is, the more flat the surface becomes.

Next, the third phenomenon will be described. When spaces containing oxygen molecules and being in contact with surfaces of the first and second resins are irradiated with vacuum ultraviolet light having a wavelength of 175 nm or less, organic molecules (polymers) in the surfaces of the first and second resins, the surfaces being in contact with the spaces, absorb the vacuum ultraviolet light and polymeric chains are probably broken. As a result, the surfaces of the resins have low molecular weight and the surfaces become soft. Thus, for example, by applying forces in directions such that the surfaces of the resins are brought into close contact with each other, the contact area between the surfaces is probably increased. In addition, by making the surfaces have low molecular weight, the surfaces become susceptible to thermal deformation, which probably allows bonding at lower temperature.

According to the present invention, by irradiating surfaces of resins with vacuum ultraviolet light having a wavelength of 175 nm or less, the above-described three phenomena are probably induced in the surfaces of the resins. The resins can be probably bonded together firmly by the synergistic effect of these three phenomena.

The irradiation with vacuum ultraviolet light in the step (I) can be performed in a standard manner. In FIG. 1A, the irradiation of the first resin 1 with the vacuum ultraviolet light 4 and the irradiation of the second resin 2 with the vacuum ultraviolet light 4 are performed simultaneously. However, the irradiation of the resins may be performed separately.

The light source will suffice as long as it can emit vacuum ultraviolet light having a wavelength of 175 nm or less and is not particularly restricted. For example, an excimer laser or an excimer lamp may be used.

In a bonding method according to the present invention, the irradiation intensity with vacuum ultraviolet light, the distance from a light source to surfaces of resins, and irradiation time are preferably appropriately adjusted such that the reached light amount is 0.1 J/cm2 or more and 10 J/cm2 or less. By making the reached light amount 0.1 J/cm2 or more, the resins can be efficiently bonded together in a short period of time. The more the reached light amount is, the more certainly the resins can be efficiently bonded together. However, when the reached light amount exceeds 10 J/cm2, problems such as high fluorescence of resins occur. Accordingly, the reached light amount is preferably made 10 J/cm2 or less.

More preferably, the reached light amount is 1 J/cm2 or more. By achieving such a reached light amount, a sufficiently large light amount of vacuum ultraviolet light reaches the surfaces of the first and second resins. Thus, excitation (generation of active oxygen species, in particular, singlet oxygen atoms, which have considerably high reactivity) of oxygen molecules is caused immediately above the surfaces of the first and second resins. As a result, the above-described three phenomena are effectively caused in the surfaces of the resins. Accordingly, the first resin and the second resin can be efficiently bonded together with more certainty with the surfaces serving as bonding surfaces. Note that, even when the reached light amount is less than 1 J/cm2 or is less than 0.1 J/cm2 (when vacuum ultraviolet light substantially does not reach the surfaces of the first and second resins), excitation of oxygen molecules is caused in spaces being in contact with the surfaces of the first and second resins and the above-described three phenomena are caused in the surfaces. Thus, the first resin and the second resin can be bonded together. When the reached light amount is relatively small, for example, the bonding is preferably performed by increasing the irradiation time with vacuum ultraviolet light, increasing the temperature of the temperature rise in the step (II), applying forces in directions such that the surfaces of the first resin and the second resin are brought into close contact with each other upon the temperature rise, or the like.

For example, in the case of irradiation with vacuum ultraviolet light having a wavelength of 172 nm at an irradiation intensity of 10 mW/cm2, for example, when the distance from a light source to a surface of a resin is made 5 mm and the irradiation is performed for 5 minutes, the vacuum ultraviolet light emitted from the light source attenuates to about 30% thereof by reaching of the light to the surface of the resin. Thus, the reached light amount is 0.9 J/cm2. When the irradiation is performed for 10 minutes under the same conditions, the reached light amount can be made 1.8 J/cm2. In this way, the reached light amount can be appropriately adjusted by appropriately adjusting the irradiation distance or the irradiation time in accordance with, for example, the irradiation intensity with a light source used.

Spaces (spaces being in contact with surfaces of the first and second resins) irradiated with vacuum ultraviolet light are spaces containing oxygen molecules such as the air. The partial pressure of oxygen in the spaces may be, for example, 10 to 105 Pa. As described above, by irradiating such spaces containing oxygen molecules with vacuum ultraviolet light, surfaces of the first and second resins in contact with the spaces are oxidized and functional groups containing oxygen atoms are generated in the surfaces.

The spaces irradiated with vacuum ultraviolet light have preferably relatively low humidity, for example, a humidity of 50% or less, more preferably, 20% or less. This is because irradiation with vacuum ultraviolet light under a high humidity environment takes time for making surfaces of substrates hydrophilic and hence it may be difficult to bond resin substrates together by irradiation with vacuum ultraviolet light for a short period of time. In the case of irradiation with vacuum ultraviolet light under a high humidity environment, as surfaces of resin substrates are made hydrophilic, water vapor near the surfaces is adsorbed to the surfaces of the substrates and coatings of adsorbed water are formed. These coatings absorb and react with active oxygen (atomic oxygen or ozone). As a result of this reaction, OH radicals are generated. Since OH radicals are less oxidative than atomic oxygen and ozone, as a result, the rate of making a surface hydrophilic probably decreases.

When irradiation with vacuum ultraviolet light is performed, the shape of a surface irradiated may be controlled by a technique such as masking.

The temperature rise in the step (II) may be performed by increasing the temperature of the entirety of the first and second resins or by increasing only the temperature of near-surface portions of the first and second resins.

The means with which the temperature rise is performed is not particularly restricted and a heater, a heating furnace, or the like may be appropriately selected.

The temperature in the temperature rise is preferably, for example, a temperature at which the first resin and the second resin are not thermally fused and may be a temperature less than the glass transition temperatures of the first and second resins. A specific temperature in the temperature rise is preferably appropriately determined in accordance with the types of the first and second resins. For example, when the first and second resins are a cycloolefin polymer (ZEONEX (registered trademark) 330R manufactured by ZEON CORPORATION; glass transition temperature: 123° C.) that will be described below in EXAMPLES, the temperature in the temperature rise may be made about 80° C. to 120° C.

Figure 6:
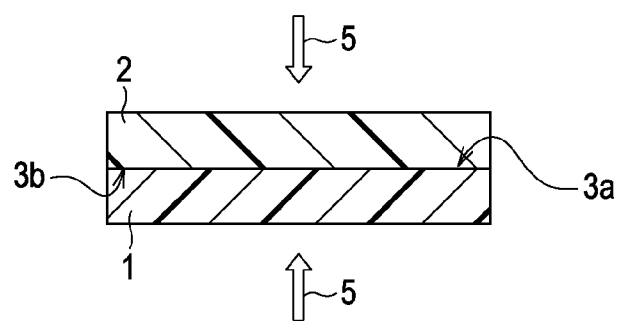
FIG. 6 is a schematic view illustrating a bonding method according to an embodiment of the present invention.

In the step (II), as illustrated in FIG. 6, while forces 5 are applied in directions such that the irradiation surface (surface 3a) of the first resin 1 and the irradiation surface (surface 3b)

of the second resin 2 are brought into close contact with each other, the temperature of the irradiation surfaces may be increased. It is generally difficult to make surfaces of resins complete flat and surfaces of resin substrates generally have warps or the like. Accordingly, by performing the temperature rise under the application of the forces in the directions, the first resin and the second resin can be bonded together with more certainty.

The magnitude of the forces applied in the directions may be appropriately determined in accordance with the shape of the first and second resins, in particular, the shape of bonding surfaces of the resins.

In a bonding method according to the present invention, at least one resin selected from the first and second resins may be optically transparent. In a bonding method according to the present invention, the first resin and the second resin can be bonded together without using organic solvents or resin compositions. Accordingly, even when at least one of the resins is optically transparent, the degradation of the optical transparency of the resins caused by bonding can be suppressed. Note that optically transparent resins are generally amorphous resins.

In a bonding method according to the present invention, the first and second resins may be resins including, in the main chains, bonds between carbon and at least one element selected from carbon, oxygen, and nitrogen. As described above, in the method according to Japanese Unexamined Patent Application Publication No. 2005-257283, one substrate needs to be a substrate of polydimethylsiloxane (PDMS) having a main chain constituted by Si—O bonds and having high affinity for silicon oxide films. In contrast, in a bonding method according to the present invention, resins including, in the main chains, bonds between carbon and at least one element selected from carbon, oxygen, and nitrogen can be bonded together; and resins in which the main chains are constituted by such bonds can also be bonded together.

In a bonding method according to the present invention, the first and second resins may be resins other than silicone resins. As described above, in the method according to Japanese Unexamined Patent Application Publication No. 2005-257283, one substrate needs to be a substrate of PDMS, which is one type of silicone resins. In contrast, according to a bonding method of the present invention, resins other than silicone resins can be bonded together.

In a bonding method according to the present invention, at least one resin selected from the first and second resins may be at least one selected from cycloolefin polymers and polycarbonate. In particular, since cycloolefin polymers have low adhesion to cycloolefin polymers or other resins due to the molecular structures of cycloolefin polymers, it is difficult to bond cycloolefin polymers by using an adhesive or the like. Use of a bonding method according to the present invention enables bonding of such cycloolefin polymers.

Specific structures of cycloolefin polymers are not particularly restricted. For example, bicyclic cycloolefin polymers such as norbornenes may be used. Bicyclic cycloolefin polymers are generally amorphous polymers and have excellent characteristics such as optical transparency, low birefringence, high heat resistance, and low hygroscopicity. In recent years, bicyclic cycloolefin polymers have been widely used for applications such as optical parts.

In a bonding method according to the present invention, the first and second resins may be identical. Specifically, cycloolefin polymers can be bonded together by a bonding method according to the present invention.

The first and second resins bonded together by a bonding method according to the present invention are bonded at high strength. It is difficult to manually separate resins bonded together by a bonding method according to the present invention. For example, when a tensile shear force is applied to resins bonded together with a tensile shear testing apparatus until the resins are separated from each other, the resins are not separated at the bonding surfaces and fracture of the base members (fracture of resins) are caused. Such high bonding strength is achieved.

By a method for bonding resins according to the present invention, the above-described high bonding strength can be achieved and resins bonded together can also be readily separated at the bonding surfaces and disassembled by using a liquid at 40° C. or more, preferably 70° C. or more, the liquid being selected from water and alcohol. For example, the entirety of bonded resins may be immersed in water at 40° C. or more so that such a liquid is fed to the bonded portions. The reason why resins bonded together by a bonding method according to the present invention can be readily separated from each other by using water at 40° C. or more or the like is not clearly known. However, as described as the first phenomenon, since the bonding surfaces have high hydrophilicity, the reason is probably that water molecules and alcohol molecules can readily reach the bonding surfaces. Alternatively, water whose pH is changed by addition of acid or base can also be probably used. Even when a liquid such as water less than 40° C. (for example, water at room temperature (20° C.)) is used, resins can be separated from each other by ultrasonic vibrations. Note that, to facilitate disassembly, with water or the like, of the first and second resin substrates that are joined, a configuration in which molecules of water or the like readily reach the bonding surfaces may be employed. For example, to intentionally leave irregularities to a certain degree for easy separation, vacuum ultraviolet light used for irradiation may be appropriately adjusted so that surfaces of resins are not made too flat. For example, when such surface irregularities have a height difference of about 20 to 40 nm, high adhesion is achieved and disassembly using water or the like is also readily performed. When surface irregularities of a substrate are considered as waves, the balance between adhesion and ease of disassembly can also be adjusted by adjusting the period of the waves. For example, when the irregularities have a period of about 10 nm to 1 μm, the balance between adhesion and ease of disassembly can be highly achieved.

In a method for producing a resin article according to the present invention, resin portions of two or more parts included in the article should be bonded together by a bonding method according to the present invention.

Specifically, spaces containing oxygen molecules and being in contact with surfaces of first and second resin portions, the surfaces serving as bonding surfaces, are irradiated with vacuum ultraviolet light having a wavelength of 175 nm or less. After the irradiation, the surfaces are subjected to temperature rise while the surfaces are in contact with each other. Thus, the first resin portion and the second resin portion are bonded together with the surfaces serving as bonding surfaces.

The type of parts including resin portions, the parts being included in resin articles, is not particularly restricted. In addition, the type of resins forming such resin portions may be similar to that of the above-described first and second resins. Specifically, such a resin may be at least one selected from cycloolefin polymers and polycarbonate.

As described above, resins bonded by a bonding method according to the present invention can be readily separated at the bonding surfaces by using water or alcohol at 40° C. or more, preferably 70° C. or more; or by using a liquid less than 40° C. and ultrasonic vibrations. Accordingly, in a resin article produced by a method for producing a resin article according to the present invention, resin portions of parts are bonded together such that the resin portions can be separated from each other by using at least one liquid at 40° C. or more selected from water and alcohol or by using a liquid less than 40° C. and ultrasonic vibrations.

Figure 7:
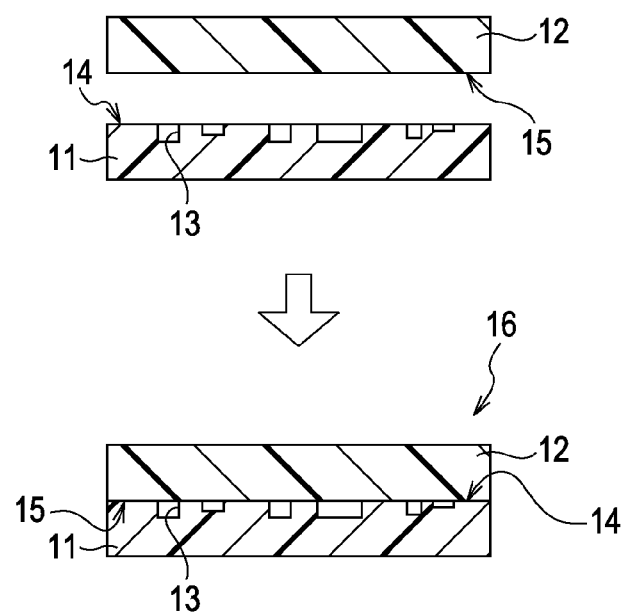
FIG. 7 is a schematic view illustrating a method for producing a microchip according to an embodiment of the present invention.

In a case where a resin article is a microchip in a method for producing a resin article according to the present invention, that is, in a method for producing a microchip according to the present invention, a pair of resin substrates (a first resin substrate 11 and a second resin substrate 12) in which microchannels are formed at least one of the substrates illustrated in FIG. 7 as an example should be bonded together by a bonding method according to the present invention. Note that, in the example illustrated in FIG. 7, channels 13 are formed in the first resin substrate 11; and a surface 14 of the first resin substrate 11 in which the channels 13 are formed and a surface 15 of the second resin substrate 12 are bonded together to form a microchip 16 including the channels 13.

Specifically, spaces containing oxygen molecules and being in contact with surfaces of the first and second resin substrates, the surfaces serving as bonding surfaces, are irradiated with vacuum ultraviolet light having a wavelength of 175 nm or less. After the irradiation, the surfaces are subjected to temperature rise while the first and second resin substrates are placed to face each other and the surfaces are in contact with each other. Thus, the first resin substrate and the second resin substrate are bonded together with the surfaces serving as bonding surfaces.

The shape, size, and the like of such resin substrates are not particularly restricted as long as channels are formed at least in one of the substrates. As illustrated in FIG. 7, the channels may be formed in the bonding surface of a resin substrate.

In a method for producing a microchip according to the present invention, when channels are formed in an irradiation surface of a resin substrate, these channels may be irradiated with ultraviolet light. The hydrophilicity of walls of channels can be enhanced by irradiation with ultraviolet light depending on the type of a resin forming a substrate. As for whether channels are irradiated with ultraviolet light or not, a standard technique such as masking can be used.

In a method for producing a microchip according to the present invention, organic solvents and resin compositions do not remain on the bonding surfaces of resin substrates. Accordingly, microchips having excellent optical characteristics can be produced. For example, when an optical detection is performed in an application of such chips, optical correction conducted in the detection can be reduced.

As described above, resins bonded together by a bonding method according to the present invention can be readily separated at the bonding surfaces by using water or alcohol at 40° C. or more, preferably 70° C. or more; or by using a liquid less than 40° C. and ultrasonic vibrations. Accordingly, in a microchip produced by a method for producing a microchip according to the present invention, resin substrates are bonded together such that the resin substrates can be separated from each other by using at least one liquid at 40° C. or more selected from water and alcohol or by using a liquid less than 40° C. and ultrasonic vibrations.

Resin articles to which a production method according to the present invention can be applied are, in addition to microchips, for example, optical parts such as resin lenses.

It has been difficult to produce optical parts such as resin lenses by bonding resin parts together. When bonding by thermal fusion is performed, produced resin lenses have distortion and have degraded optical characteristics. When bonding with an organic solvent or a resin composition is performed, coating of such a substance remains at the bonding surfaces, which degrades optical characteristics.

In contrast, by a method for producing a resin article according to the present invention, resin parts constituting a resin lens can be bonded together at a temperature lower than in bonding by thermal fusion and organic solvents and resin compositions do not remain at the bonding surfaces. Thus, degradation of optical characteristics of produced lenses can be suppressed. In addition, such combination of two or more resin parts allows production of optical parts having complicated shapes that have been difficult to produce.

EXAMPLES

Hereinafter, the present invention will be described in further detail using EXAMPLES. The present invention is not restricted to EXAMPLES described below.

Example 1

Surfaces of a pair of resin substrates (70 mm×20 mm, thickness: 2 mm) composed of a cycloolefin polymer (ZEONEX (registered trademark) 330R manufactured by ZEON CORPORATION; glass transition temperature: 123° C.) were irradiated with vacuum ultraviolet light (wavelength: 172 nm) from a Xe excimer lamp (UER20-172A manufactured by USHIO INC.). The irradiation with the ultraviolet light was performed in the air. The distance between the lamp and the surfaces of the substrates was made 5 mm or 30 mm. The irradiation intensity was made 10 mW/cm2. In the case where the irradiation distance was 5 mm, the irradiation time was made 5 minutes or 10 minutes. In the case where the irradiation distance was 30 mm, the irradiation time was made 10 minutes or 40 minutes. The vacuum ultraviolet light was radiated to the entirety of a main surface of each substrate.

The substrates having been irradiated with ultraviolet light were then faced to each other such that the irradiated surfaces were in contact with each other. While forces were applied at a pressure of 0.7 MPa in directions such that the irradiated surfaces were brought into close contact with each other, the temperature of the entire substrates were increased to 100° C. and this state was maintained for an hour.

Then, after the entire substrates were allowed to cool to room temperature, the forces were removed and the substrates were inspected to determine whether the substrates were bonded together. For the substrates obtained at the irradiation distance of 5 mm, the substrates were firmly bonded together in the cases of the irradiation time of 5 minutes and 10 minutes and were not separated from each other without being fractured. For the substrates obtained at the irradiation distance of 30 mm, bonding was insufficient in the case of the irradiation time of 10 minutes whereas the substrates were firmly bonded together in the case of the irradiation time of 40 minutes.

The above-described results show that, resins can be readily bonded together in the case of the irradiation distance of 5 mm in which reached light amount is in the range of 0.1 J/cm2 to 10 J/cm2 even when the irradiation time is short. It has also been demonstrated that, even in the case of the irradiation distance of 30 mm in which reached light amount is smaller than the above case and only the spaces being in contact with substrate surfaces are seen to be substantially irradiated with vacuum ultraviolet light (the substrate surfaces are not substantially irradiated with vacuum ultraviolet light), resins can be bonded together by increasing the irradiation time.

Figure 8:
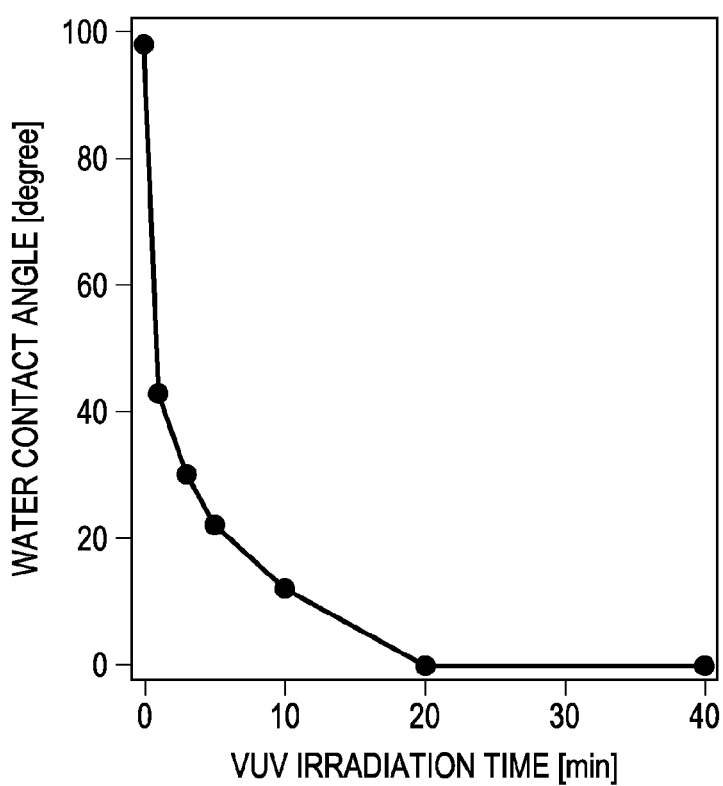
FIG. 8 illustrates results of water contact angle obtained by measuring substrate surfaces in which the irradiation distance was made 5 mm and the irradiation time were varied from 0 to 40 minutes.
Figure 9:
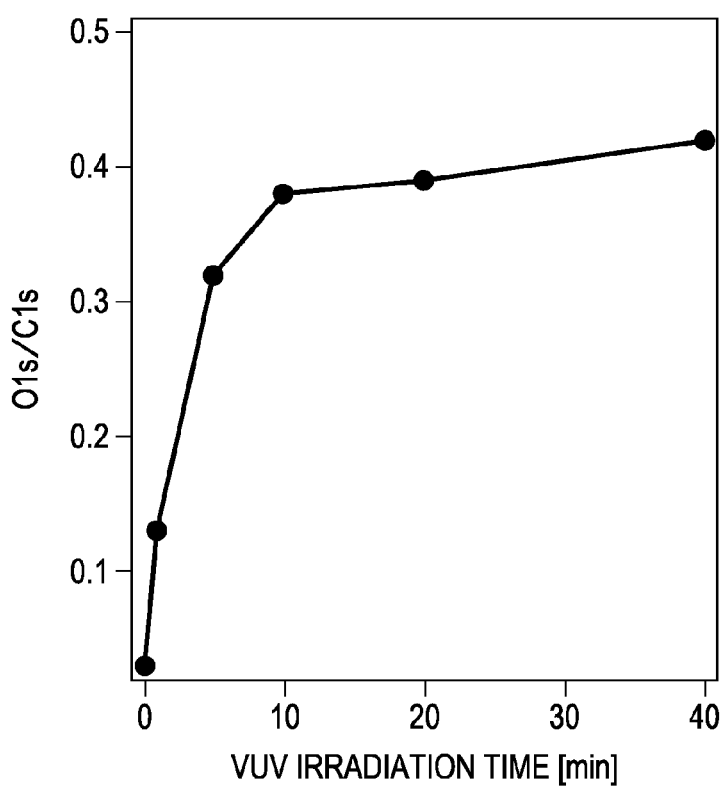
FIG. 9 illustrates the ratio of oxygen atoms to carbon atoms calculated from the measurement results by X-ray-induced photoelectron spectroscopy in terms of substrate surfaces in which the irradiation distance was made 5 mm and the irradiation time was varied from 0 to 40 minutes.
Figure 10:
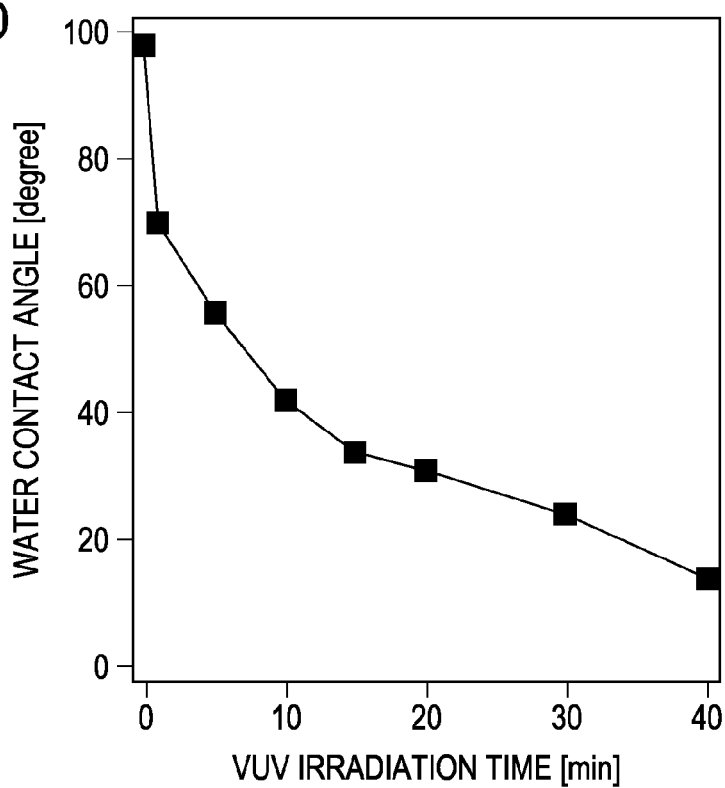
FIG. 10 illustrates results of water contact angle obtained by measuring substrate surfaces in which the irradiation distance was made 30 mm and the irradiation time was varied from 0 to 40 minutes.
Figure 11:
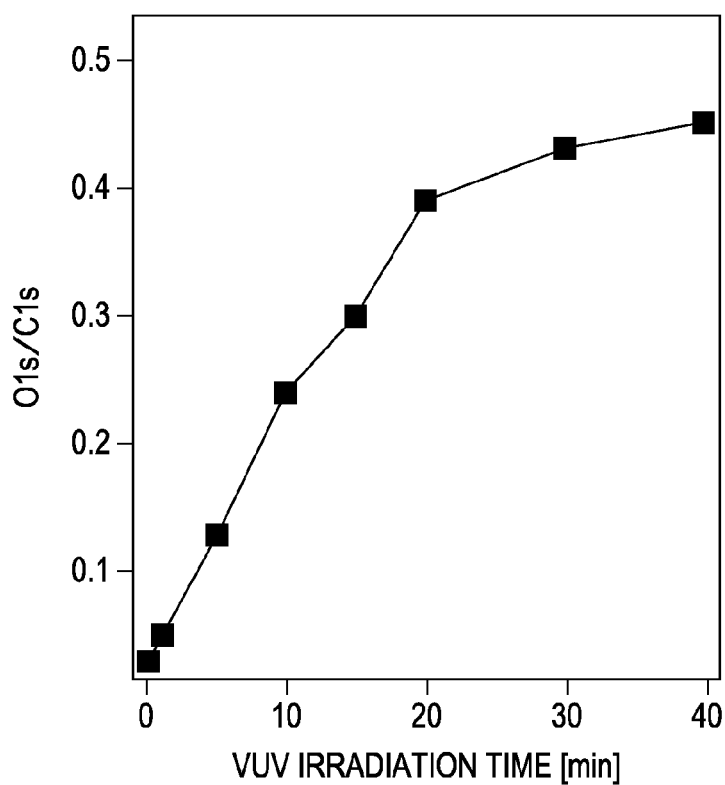
FIG. 11 illustrates the ratio of oxygen atoms to carbon atoms calculated from the measurement results by X-ray-induced photoelectron spectroscopy in terms of substrate surfaces in which the irradiation distance was made 30 mm and the irradiation time was varied from 0 to 40 minutes.

Here, to inspect the state of the substrate surfaces having been irradiated with vacuum ultraviolet light, the substrate surfaces in which the irradiation distance was 5 mm or 30 mm and the irradiation time was changed in the range of 0 to 40 minutes were measured in terms of water contact angle with an automatic contact angle meter (DM500 manufactured by Kyowa Interface Science Co., Ltd.). Furthermore, the substrate surfaces were also subjected to an XPS measurement. For the cases of the irradiation distance of 5 mm, the results in terms of water contact angle are illustrated in FIG. 8 and the results of the XPS measurement are illustrated in FIG. 9. For the cases of the irradiation distance of 30 mm, the results in terms of water contact angle are illustrated in FIG. 10 and the results of the XPS measurement are illustrated in FIG. 11. These results show that, the longer the time for which irradiation with vacuum ultraviolet light is performed becomes (the more the light amount of vacuum ultraviolet light reaching a substrate surface becomes), the considerably less the contact angle becomes and the more enhanced the hydrophilicity of the substrate surface becomes. The ratios of oxygen atoms to carbon atoms calculated from the results of the XPS measurement illustrated in FIGS. 9 and 11 show that, the longer the time for which irradiation with vacuum ultraviolet light is performed becomes (the more the light amount of vacuum ultraviolet light reaching a substrate surface becomes), the considerably more oxygen atoms increase.

Example 2

Surfaces of a pair of resin substrates (70 mm×20 mm, thickness: 2 mm) composed of a cycloolefin polymer (ZEONEX (registered trademark) 330R manufactured by ZEON CORPORATION; glass transition temperature: 123° C.) were irradiated with vacuum ultraviolet light (wavelength: 172 nm) from a Xe excimer lamp (UER20-172A manufactured by USHIO INC.). The irradiation with the vacuum ultraviolet light was performed in the air. The distance between the lamp and the surfaces of the substrates was made 5 mm. The irradiation intensity was made 10 mW/cm2. The irradiation time was made 5 minutes or 10 minutes. The vacuum ultraviolet light was radiated to the entirety of a main surface of each substrate. Note that, when the distance between the lamp and the surfaces of the substrates was made 5 mm, the light amount of vacuum ultraviolet light reaching a substrate surface per second is 3 mJ/cm2·s. Accordingly, the reached light amount in the cases of the irradiation time of 5 minutes was 0.9 J/cm2. The reached light amount in the cases of the irradiation time of 10 minutes was 1.8 J/cm2.

Next, the substrates having been irradiated with vacuum ultraviolet light were faced to each other such that the irradiated surfaces were in contact with each other. While forces (pressure) were applied in directions such that the irradiated surfaces were brought into close contact with each other, the entire substrates were subjected to temperature rise and this state was maintained. The pressure, the temperature of the temperature rise, and the maintaining time were varied. The results obtained by inspecting bonding states are shown in Table 1 and Table 2. Note that, in the Tables, cases in which the bonding state was good were denoted by "Good" and cases in which the bonding state was poor were denoted by "Poor". The good bonding state refers to a state in which substrates are not manually separated at the bonding surfaces and application of a tensile shear force until the substrates are separated from each other causes fracture of the substrates themselves. The poor bonding state refers to a state in which substrates are manually readily separated at the bonding surfaces.

TABLE 1

| | 0.3 MPa | | | | 0.4 MPa | | | | 0.5 MPa | | | | 0.6 MPa | | | |
|---|---|---|---|---|---|---|---|---|---|---|---|---|---|---|---|---|
| | | | | | | | | Time | | | | | | | | |
| Temperature | 30 s | 1 min | 3 min | 5 min | 30 s | 1 min | 3 min | 5 min | 30 s | 1 min | 3 min | 5 min | 30 s | 1 min | 3 min | 5 min |
| 50° C. | Poor | Poor | Poor | Poor | Poor | Poor | Poor | Poor | Poor | Poor | Poor | Poor | Poor | Poor | Poor | Poor |
| 60° C. | Poor | Poor | Poor | Poor | Poor | Poor | Poor | Poor | Poor | Poor | Poor | Poor | Poor | Poor | Poor | Poor |
| 70° C. | Poor | Poor | Poor | Poor | Poor | Poor | Poor | Poor | Poor | Poor | Poor | Poor | Poor | Poor | Poor | Poor |
| 80° C. | Poor | Poor | Good | Good | Poor | Poor | Good | Good | Poor | Poor | Good | Good | Poor | Poor | Good | Good |
| 90° C. | Poor | Poor | Good | Good | Poor | Good | Good | Good | Poor | Good | Good | Good | Good | Good | Good | Good |
| 100° C. | Good | Good | Good | Good | Good | Good | Good | Good | Good | Good | Good | Good | Good | Good | Good | Good |

TABLE 2

| | 0.3 MPa | | | | 0.4 MPa | | | | 0.5 MPa | | | | 0.6 MPa | | | |
|---|---|---|---|---|---|---|---|---|---|---|---|---|---|---|---|---|
| | | | | | | | | Time | | | | | | | | |
| Temperature | 30 s | 1 min | 3 min | 5 min | 30 s | 1 min | 3 min | 5 min | 30 s | 1 min | 3 min | 5 min | 30 s | 1 min | 3 min | 5 min |
| 50° C. | Poor | Poor | Poor | Poor | Poor | Poor | Poor | Poor | Poor | Poor | Poor | Poor | Poor | Poor | Poor | Poor |
| 60° C. | Poor | Poor | Poor | Poor | Poor | Poor | Poor | Poor | Poor | Poor | Poor | Poor | Poor | Poor | Poor | Poor |
| 70° C. | Poor | Poor | Poor | Poor | Poor | Poor | Poor | Poor | Poor | Poor | Poor | Poor | Poor | Poor | Poor | Poor |
| 80° C. | Poor | Poor | Good | Good | Poor | Poor | Good | Good | Poor | Poor | Good | Good | Poor | Poor | Good | Good |
| 90° C. | Poor | Poor | Good | Good | Good | Good | Good | Good | Good | Good | Good | Good | Good | Good | Good | Good |
| 100° C. | Good | Good | Good | Good | Good | Good | Good | Good | Good | Good | Good | Good | Good | Good | Good | Good |

These results show that, in the cases of the irradiation time of 10 minutes in which the reached light amount exceeds 1 J/cm2, conditions in terms of temperature and pressure required for bonding are loosened.

Example 3

Surfaces of a pair of resin substrates (70 mm×20 mm, thickness: 2 mm) composed of a cycloolefin polymer (ZEONEX (registered trademark) 330R manufactured by ZEON CORPORATION; glass transition temperature: 123° C.) were irradiated with vacuum ultraviolet light (wavelength: 172 nm) from a Xe excimer lamp (UER20-172A manufactured by USHIO INC.). The irradiation with the ultraviolet light was performed in the air. The distance between the lamp and the surfaces of the substrates was made 5 mm. The irradiation intensity was made 10 mW/cm$^2$. The irradiation time was made 5 minutes. The vacuum ultraviolet light was radiated to the entirety of a main surface of each substrate.

The substrates having been irradiated with ultraviolet light were then faced to each other such that the irradiated surfaces were in contact with each other. While forces were applied at a pressure of 0.7 MPa in directions such that the irradiated surfaces were brought into close contact with each other, the temperature of the entire substrates was increased to 100° C. and this state was maintained for 5 minutes.

Then, after the entire substrates were allowed to cool to room temperature, the forces were removed and the substrates were inspected to determine whether the substrates were bonded together. The substrates were firmly bonded together.

Five samples in a state in which resin substrates were bonded together by the above-described method were prepared. The samples were immersed in water at 5° C., room temperature (18° C.), 40° C., 60° C., and 90° C. and maintained in the water. The samples had a size of 8 mm×8 mm. The results are shown in Table 3.

TABLE 3

The measurement was performed with square samples of 8 mm per side.

| 5° C. | Room temperature (18° C.) | 40° C. | 60° C. | 90° C. |
|---|---|---|---|---|
| No separation | No separation | Separated within 5 minutes | Separated within 5 minutes | Separated within 5 minutes |

For the samples having been immersed in water at 5° C. and in water at room temperature, separation of the resin substrates was not caused. In contrast, for the samples having been immersed in water at 40° C., 60° C., and 90° C., the resin substrates were separated at the bonding surfaces and disassembled into two resin substrates.

By additionally applying a physical impact such as ultrasonic waves to the above-described samples, the disassembly into two resin substrates was rapidly achieved.

It was also demonstrated that, when samples similar to the above-described samples were immersed in boiling ethanol at 78° C., the samples were separated in 20 minutes.

The above-described results show that a resin article formed by bonding resin parts (resin substrates in this EXAMPLE) together by a bonding method according to the present invention can be disassembled with hot water at 90° C. without fracturing the resin parts.

Example 4

Surfaces of a pair of resin substrates (70 mm×26 mm, thickness: 1 mm) composed of a cycloolefin polymer (ZEONEX (registered trademark) 330R manufactured by ZEON CORPORATION; glass transition temperature: 123° C.) were irradiated with vacuum ultraviolet light (wavelength: 172 nm) from a Xe excimer lamp (UER20-172A manufactured by USHIO INC.). The irradiation with the ultraviolet light was performed in the air. The distance between the lamp and the surfaces of the substrates was made 5 mm. The irradiation intensity was made 10 mW/cm2. The irradiation time was made 5 minutes. The vacuum ultraviolet light was radiated to the entirety of a main surface of each substrate.

The substrates having been irradiated with ultraviolet light were then faced to each other such that the irradiated surfaces were in contact with each other (the joining area became 26 mm×26 mm). While forces were applied at a pressure of 0.15 MPa in directions such that the irradiated surfaces were brought into close contact with each other, the temperature of the entire substrates was increased to 100° C. and this state was maintained for 5 minutes.

Then, after the entire substrates were allowed to cool to room temperature, the forces were removed and the substrates were inspected to determine whether the substrates were bonded together. The substrates were firmly bonded together.

Samples in a state in which resin substrates were bonded together by the above-described method were immersed in water at room temperature (20° C.) and maintained in the water. The samples did not separate even after the immersion for an hour.

Then, similar samples were immersed in water at room temperature and also subjected to ultrasonic vibrations. The ultrasonic vibrations were performed with an ultrasonic cleaning apparatus (Model: "US-102") manufactured by SND Co., Ltd. at a high frequency output of 100 W and at a vibration frequency of 38 kHz. As a result, the resin substrates were separated in 36 minutes.

Example 5

In EXAMPLE 5, the influence of the humidity of an atmosphere in the irradiation with vacuum ultraviolet light on bonding of resins in a method for bonding resins according to the present invention was studied.

Surfaces of resin substrates (26 mm×76 mm, thickness: 1 mm) composed of a cycloolefin polymer (ZEONEX (registered trademark) 480R manufactured by ZEON CORPORATION; glass transition temperature: 138° C.) were irradiated with vacuum ultraviolet light (wavelength: 172 nm) from a Xe excimer lamp (UER20-172A manufactured by USHIO INC.). The distance between the lamp and the surfaces of the substrates was made 5 mm. The irradiation intensity was made 10 mW/cm2. The vacuum ultraviolet light was radiated to the entirety of a main surface of each substrate.

The substrates having been irradiated with ultraviolet light were then faced to each other such that the irradiated surfaces were in contact with each other. While forces were applied at a pressure of 0.5 MPa in directions such that the irradiated surfaces were brought into close contact with each other, the temperature of the entire substrates was increased to 80° C.

and this state was maintained for 5 minutes. Thus, a pair of resin substrates was bonded together.

Figure 12:
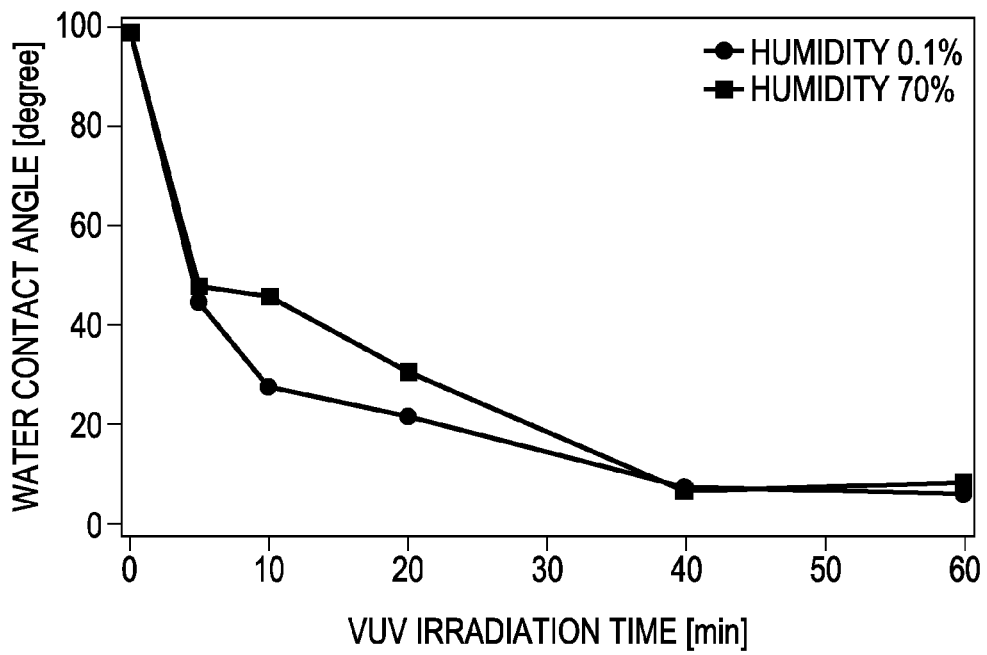
FIG. 12 illustrates results of water contact angle obtained by measuring substrate surfaces in which the irradiation time was varied from 0 to 60 minutes at humidity of 0.1% and 70%.
Figure 13:
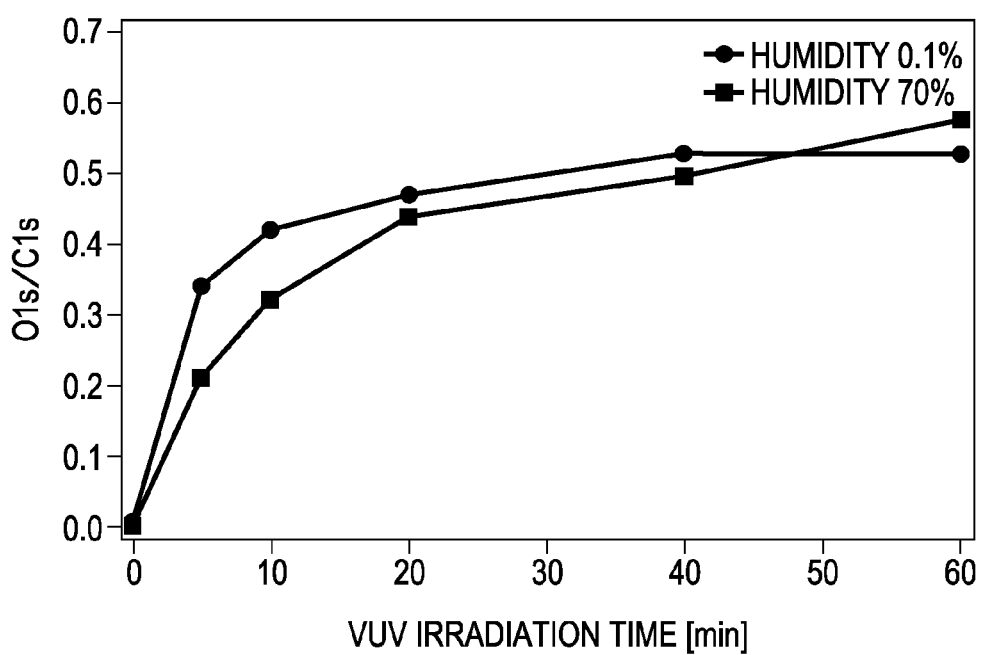
FIG. 13 illustrates the ratio of oxygen atoms to carbon atoms calculated from the measurement results by X-ray-induced photoelectron spectroscopy in terms of substrate surfaces in which the irradiation time was varied from 0 to 60 minutes at humidity of 0.1% and 70%.

In this EXAMPLE, the humidity of an atmosphere in the irradiation with vacuum ultraviolet light was made 0.1% (use of dry air only) or 70%. The state of substrate surfaces irradiated with vacuum ultraviolet light at varying irradiation times of 0, 5, 10, 20, 40, and 60 minutes at humidity of 0.1% and 70% was inspected. The inspection of the state of the substrate surfaces was performed by the measurement of water contact angle and XPS measurement as in EXAMPLE 1. The results in terms of water contact angle are illustrated in FIG. 12. The results of the XPS measurement are illustrated in FIG. 13. The results illustrated in FIG. 12 show that there was no difference between the final water contact angles at a humidity of 0.1% and at a humidity of 70% at the irradiation time of 60 minutes with vacuum ultraviolet light; however, in the midstream stage (the irradiation time of 10 to 40 minutes with vacuum ultraviolet light), the water contact angle at a humidity of 0.1% was larger than that at a humidity of 70%. That is, the rate of making a substrate surface hydrophilic was larger at the lower humidity. In addition, the ratio (O1s/C1s) of oxygen atoms to carbon atoms calculated from the results of the XPS measurement illustrated in FIG. 13 shows that, during the irradiation time of 0 to 40 minutes with vacuum ultraviolet light, oxygen atoms considerably increase at a humidity of 0.1% compared with at a humidity of 70%. This result shows that, at low humidity, more oxygen-containing hydrophilic functional groups are probably generated on a substrate surface by irradiation with vacuum ultraviolet light for a short period of time.

Furthermore, the bonding strength of pairs of resin substrates having been bonded at humidity of 0.1% and 70% with the irradiation times of 5, 10, 20, 40, and 60 minutes was evaluated. The bend strength of the bonded resin substrates was measured to evaluate the bonding strength. The measurement method of the bend strength was as follows: plate-shaped samples of 76 mm×26 mm×thickness 1 mm were joined to form a cruciform (joined area: 26×26 mm2). A force was vertically applied from above to the center of the joined portion to bend the sample. At this time, the indentation strength was measured with a load cell to evaluate the bonding strength. The measurement results are shown in Table 4.

TABLE 4

| Humidity 0.1% | | Humidity 70 ± 2% | |
|---|---|---|---|
| Irradiation time with vacuum ultraviolet light (min) | Bend strength (N/cm$^2$) | Irradiation time with vacuum ultraviolet light (min) | Bend strength (N/cm$^2$) |
| 5 | Not measurable | 5 | Not measurable |
| 10 | 0.5 | 10 | Not measurable |
| 20 | 1 | 20 | 0.5 |
| 40 | 4 | 40 | 4 |
| 60 | 4 | 60 | 4 |

These results show that resins can be bonded together by irradiation with ultraviolet light for a short period of time at a humidity of 0.1% compared with at a humidity of 70%.

Comparative Example 1

As COMPARATIVE EXAMPLE 1, an example in which resin substrates were irradiated with vacuum ultraviolet light in an atmosphere containing no oxygen molecules and the state of the resin surfaces was inspected will be described.

Surfaces of resin substrates (26 mm×76 mm, thickness: 1 mm) composed of a cycloolefin polymer (ZEONEX (registered trademark) 480R manufactured by ZEON CORPORATION; glass transition temperature: 138° C.) were irradiated with vacuum ultraviolet light (wavelength: 172 nm) from a Xe excimer lamp (UER20-172A manufactured by USHIO INC.). The distance between the lamp and the surfaces of the substrates was made 5 mm. The irradiation intensity was made 10 mW/cm2. The vacuum ultraviolet light was radiated to the entirety of a main surface of each substrate. In this COMPARATIVE EXAMPLE, the resin substrates were irradiated with vacuum ultraviolet light in an atmosphere containing no oxygen molecules by purging the air with nitrogen gas. At this time, the humidity was 1±1%.

Figure 14:
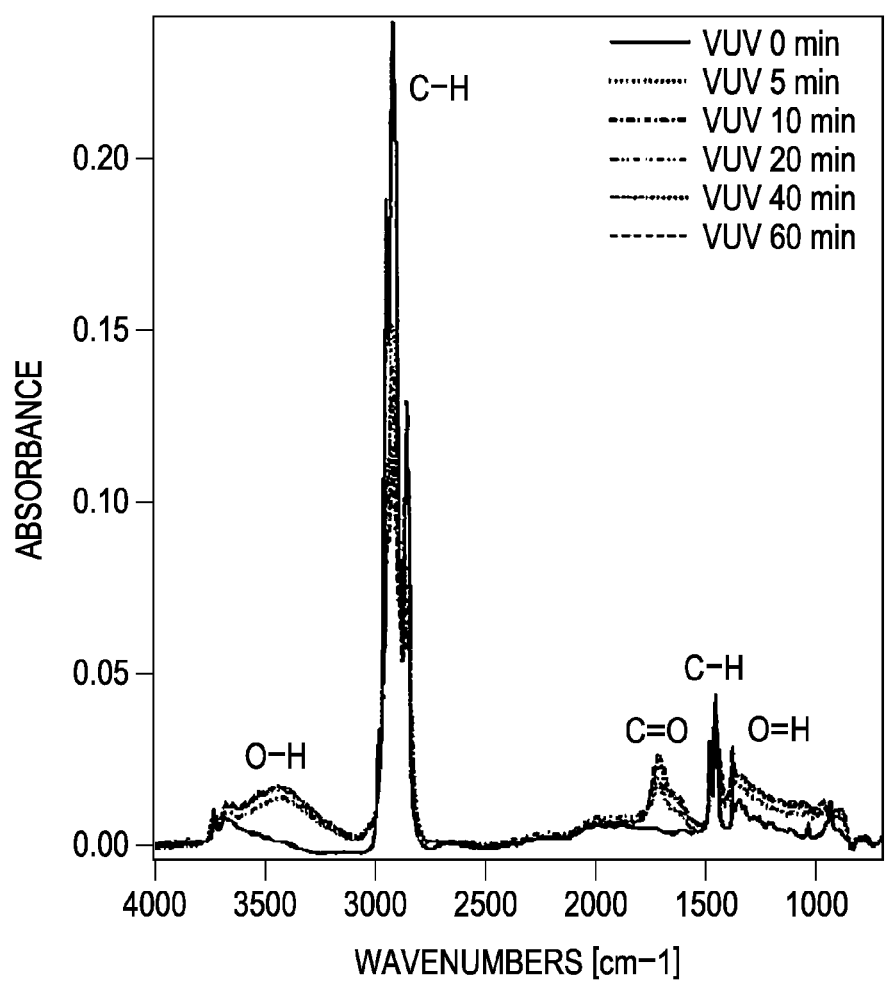
FIG. 14 illustrates results obtained by measuring with a Fourier transform infrared spectrophotometer the state of irradiated surfaces of resins having been irradiated with vacuum ultraviolet light in an atmosphere containing no oxygen molecules.
Figure 15:
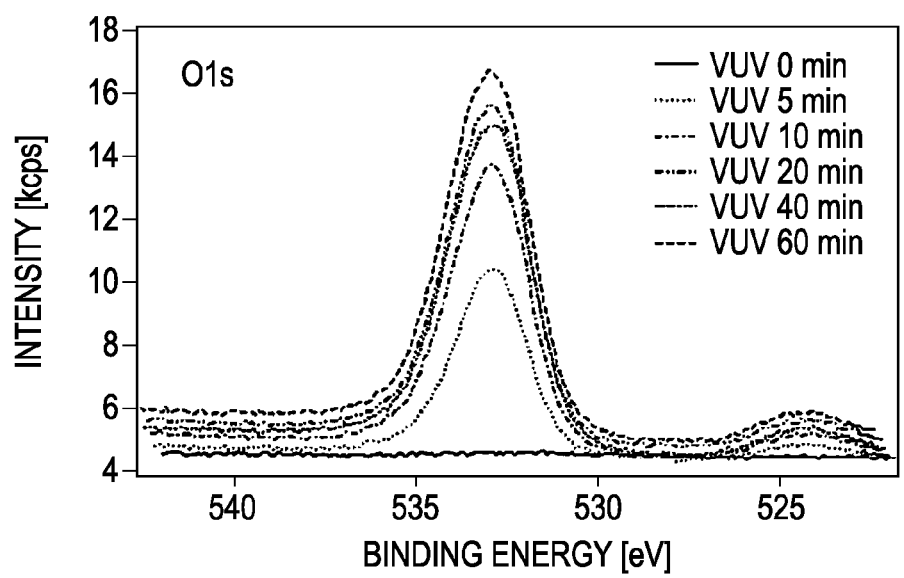
FIG. 15 illustrates results obtained by measuring by X-ray-induced photoelectron spectroscopy the state of irradiated surfaces of resins having been irradiated with vacuum ultraviolet light in an atmosphere containing no oxygen molecules.
Figure 16:
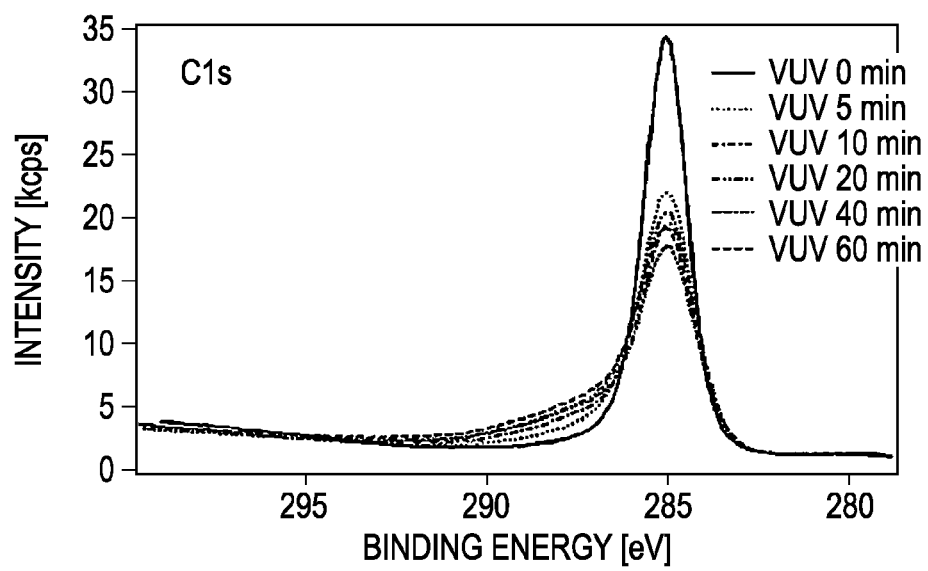
FIG. 16 illustrates results obtained by measuring by X-ray-induced photoelectron spectroscopy the state of irradiated surfaces of resins having been irradiated with vacuum ultraviolet light in an atmosphere containing no oxygen molecules.

In this COMPARATIVE EXAMPLE, the state of substrate surfaces having been irradiated with vacuum ultraviolet light for varying irradiation times of 0, 5, 10, 20, 40, and 60 minutes was inspected. The inspection of the state of substrate surfaces was performed with the results in terms of water contact angle, FT-IR measurement, and XPS measurement. The measurement results of water contact angle are shown in Table 5. The results by FT-IR are illustrated in FIG. 14. The measurement results by XPS are illustrated in FIGS. 15 and 16. Atomic percent of oxygen atoms and carbon atoms calculated from the results by the XPS measurement are shown in Table 6.

TABLE 5

| Irradiation time with vacuum ultraviolet light (min) | Water contact angle |
|---|---|
| 0 | 99° |
| 5 | 85° |
| 10 | 79° |
| 20 | 60° |
| 40 | 48° |
| 60 | 46° |

TABLE 6

| Irradiation time with vacuum ultraviolet light (min) | Atom % | |
|---|---|---|
| | O | C |
| 5 | 11.20 | 88.80 |
| 10 | 17.30 | 82.70 |
| 20 | 19.01 | 80.99 |
| 40 | 20.65 | 79.35 |
| 60 | 21.01 | 78.99 |

The results of water contact angles show that, even when irradiation with vacuum ultraviolet light for 60 minutes is performed, the water contact angle is 46° and the substrate surface is not sufficiently made hydrophilic. The results by FT-IR show that irradiation with vacuum ultraviolet light does not cause a considerable increase in the amount of O—H groups and C═O groups in the surfaces of the resins. Note that a slight increase is probably caused by the influence of oxygen or water vapor present in trace amounts in the atmosphere. The results by XPS illustrated in FIGS. 15 and 16 also show that an increase in oxygen and a decrease in carbon are caused by irradiation with vacuum ultraviolet light; however, this is probably caused by the influence of oxygen or water vapor remaining in the atmosphere. The results in Table 6 also show that the ratio of oxygen atoms to carbon atoms in this COMPARATIVE EXAMPLE is smaller than that of EXAMPLE 1 and oxidation of the substrate surfaces is insufficient.

Comparative Example 2

As COMPARATIVE EXAMPLE 2, an example in which bonding of resins was attempted by irradiating resin substrates with vacuum ultraviolet light in an atmosphere containing no oxygen molecules will be described.

Surfaces of resin substrates (26 mm×76 mm, thickness: 1 mm) composed of a cycloolefin polymer (ZEONEX (registered trademark) 480R manufactured by ZEON CORPORATION; glass transition temperature: 138° C.) were irradiated with vacuum ultraviolet light (wavelength: 172 nm) from a Xe excimer lamp (UER20-172A manufactured by USHIO INC.). The distance between the lamp and the surfaces of the substrates was made 5 mm. The irradiation time was made 10 minutes. The irradiation intensity was made 10 mW/cm2. The vacuum ultraviolet light was radiated to the entirety of a main surface of each substrate. In this COMPARATIVE EXAMPLE, the resin substrates were irradiated with vacuum ultraviolet light in an atmosphere containing no oxygen molecules by purging the air with nitrogen gas. At this time, the humidity was 1±1%.

Next, the substrates having been irradiated with vacuum ultraviolet light were faced to each other such that the irradiated surfaces were in contact with each other. While forces (pressure) were applied in directions such that the irradiated surfaces were brought into close contact with each other, the entire substrates were subjected to temperature rise and this state was maintained. The results obtained by inspecting bonding states in which the pressure, the temperature of the temperature rise, and the maintaining time were changed are shown in Table 7. Note that, in the Table, cases in which the bonding state was good were denoted by "Good" and cases in which the bonding state was poor were denoted by "Poor". The good bonding state refers to a state in which substrates are not manually separated at the bonding surfaces and application of a tensile shear force until the substrates are separated from each other causes fracture of the substrates themselves. The poor bonding state refers to a state in which substrates are manually readily separated at the bonding surfaces.

TABLE 7

| | 0.4 MPa | | | | 0.5 MPa | | | | 0.7 MPa | | | | 0.8 MPa | | | |
|---|---|---|---|---|---|---|---|---|---|---|---|---|---|---|---|---|
| | | | | | | | | Time | | | | | | | | |
| Temperature | 30 s | 1 min | 3 min | 5 min | 30 s | 1 min | 3 min | 5 min | 30 s | 1 min | 3 min | 5 min | 30 s | 1 min | 3 min | 5 min |
| 80° C. | Poor | Poor | Poor | Poor | Poor | Poor | Poor | Poor | Poor | Poor | Poor | Poor | Poor | Poor | Poor | Poor |
| 90° C. | Poor | Poor | Poor | Poor | Poor | Poor | Poor | Poor | Poor | Poor | Poor | Poor | Poor | Poor | Poor | Poor |
| 100° C. | Poor | Poor | Poor | Poor | Poor | Poor | Poor | Poor | Poor | Poor | Poor | Poor | Poor | Poor | Poor | Poor |

As shown in Table 7, even when the temperature was increased to 100° C. and the pressure was increased to 0.8 MPa, good bonding was not achieved. These results show that bonding of resins require irradiation with vacuum ultraviolet light in an atmosphere containing oxygen.

According to the present invention, a bonding method in which a resin and a resin can be bonded together with high productivity at a temperature lower than that in bonding by thermal fusion can be provided. A bonding method according to the present invention can be applied to methods for producing various resin articles, for example, it can be applied to a method for producing a microchip. Furthermore, according to a bonding method of the present invention, since resins having been bonded together can be readily separated from each other, for example, recycling of resins is advantageously performed. For example, when a bonding method according to the present invention is applied to medical microchips such as blood test chips, such microchips after use can be separated and disassembled and microchannel portions can be washed. As a result, medical microchips after use can be disposed of not as medical waste but as general plastic waste.

What is claimed is:

1. A resin article comprising a plurality of parts including resin portions, the plurality of parts being bonded together through the resin portions,
   wherein the resin portions are bonded to each other by a method for bonding a first resin and a second resin, the method comprising the steps of:
   (I) irradiating a space containing oxygen molecules with vacuum ultraviolet light having a wavelength of 175 nm or smaller, the space being adjacent to a first surface of the first resin and a second surface of the second resin; and
   (II) after the irradiating, placing the first surface and the second surface in contact with each other, and increasing a temperature such that the first resin and the second resin are bonded to each other via the first and second surfaces serving as bonding surfaces,
   wherein the bonded resin portions are configured to become separable from each other by applying at least one liquid selected from water and alcohol at a temperature of 40° C. or higher, or by applying the liquid at a temperature lower than 40° C. in combination with ultrasonic vibrations.

2. The resin article according to claim 1, wherein in the method for bonding, the step (I) also irradiates the first surface and the second surface with the vacuum ultraviolet light.

3. The resin article according to claim 2, wherein, in the irradiating, an amount of the vacuum ultraviolet light reaching the first and second surfaces is in a range from 0.1 J/cm$^2$ to 10 J/cm$^2$.

4. The resin article according to claim 3, wherein, in the irradiating, the amount of the vacuum ultraviolet light reaching the first and second surfaces is in a range of 1 J/cm$^2$ to 10 J/cm$^2$.

5. The resin article according to claims 1, wherein, in the irradiating, a partial pressure of oxygen in the space is 10 to 10$^5$ Pa.

6. The resin article according to claim 1, wherein the step (II) increases the temperature to a temperature lower than glass transition temperatures of the first and second resins.

7. The resin article according to claim 1, wherein the method the step (II) further comprises:
   applying a force in a direction such that the first and second surfaces are pressed against each other while the temperature is being increased.

8. The resin article according to claim 1, wherein respective main chains of the first and second resins include a bond between carbon and at least one element selected from carbon, oxygen, and nitrogen.

9. The resin article according to claim 1, wherein at least one of the first and second resins is selected from cycloolefin polymers and polycarbonate.

10. The resin article according to claim 9, wherein the at least one of the first and second resins is a bicyclic cycloolefin polymer.

11. The resin article according to claim 1, wherein the first and second resins are of a same type.

12. The resin article according to claim 1, wherein the resin article includes an optical part or a resin lens.

13. The resin article according to claim 1, wherein the plurality of parts are a pair of resin substrates bonded to each other, at least one of the resin substrates including a microchannel.

14. The resin article according to claim 1, wherein in the step (I), the irradiating reduces irregularities of the first and second surfaces while maintaining certain surface roughness of the first and second surfaces.

15. A resin article comprising a plurality of parts including resin portions, the plurality of parts being bonded together through the resin portions,
wherein the resin portions are bonded to each other by a method for bonding a first resin and a second resin, the method comprising the steps of:
(I) irradiating a space containing oxygen molecules with vacuum ultraviolet light having a wavelength of 175 nm or smaller, the space being adjacent to a first surface of the first resin and a second surface of the second resin, the irradiating reducing irregularities of the first and second surfaces while maintaining certain surface roughness of the first and second surfaces; and
(II) after the irradiating, placing the first surface and the second surface in contact with each other, and increasing a temperature such that the first resin and the second resin are bonded to each other via the first and second surfaces serving as bonding surfaces,
wherein the certain surface roughness of the first and second surfaces allows the first and second resins to become separable from each other if at least one liquid selected from water and alcohol at a temperature of 40° C. or greater is applied, or the liquid at a temperature less than 40° C. in combination with ultrasonic vibrations is applied.

16. The resin article according to claim 15, wherein a height difference of the irregularities is adjusted in a range of 20 to 40 nm by the irradiating.

17. The resin article according to claim 15, wherein the resin article includes an optical part or a resin lens.

18. The resin article according to claim 15, wherein the plurality of parts are a pair of resin substrates bonded to each other, at least one of the resin substrates including a microchannel.

* * * * *